United States Patent [19]

Holmstrom et al.

[11] Patent Number: 5,093,225

[45] Date of Patent: Mar. 3, 1992

[54] PROCESSING METHOD FOR FABRICATING ELECTRICAL CONTACTS TO MESA STRUCTURES IN SEMICONDUCTOR DEVICES

[75] Inventors: Roger P. Holmstrom, Wayland; Edmund Meland, Chelmsford; F. David Crawford, Melrose, all of Mass.

[73] Assignee: GTE Laboratories Incorporated, Waltham, Mass.

[21] Appl. No.: 583,410

[22] Filed: Sep. 14, 1990

[51] Int. Cl.$^5$ .............................................. G03F 7/00
[52] U.S. Cl. ..................................... 430/311; 430/315; 430/396; 430/313; 437/229; 437/928
[58] Field of Search ............... 430/314, 322, 323, 324, 430/325, 311, 313, 315, 317, 327, 396; 156/625, 643, 648, 649; 437/61, 63, 228, 229, 235, 928

[56] References Cited

U.S. PATENT DOCUMENTS 4,600,685 7/1986 Kitakohji et al. ................ 430/325
4,783,238 11/1988 Roesner ........................... 430/314

Primary Examiner—Marion E. McCamish
Assistant Examiner—Kathleen Duda
Attorney, Agent, or Firm—Victor F. Lohmann, III

[57] ABSTRACT

A semiconductor mesa structure is covered with a photoresist material in a localized flooding manner such that the photoresist material is thinner on the top of the mesas and also at the upper most portion of the sidewalls than at the base of the mesa and the intervening channel. The photoresist is then exposed through a mask in a manner so that when developed, the photoresist from the mesa top and upper most portion of the sidewall can be removed. When the photoresist is exposed to the actinic radiaction, the thinner photoresist is adequately exposed more rapidly than the thicker portion nearer the bottom of the mesa, if the mask does not adequately shield the actinic radiation from reaching it. Thus the alignment tolerance is greater than if the photoresist were of uniform thickness.

6 Claims, 3 Drawing Sheets

PROCESSING METHOD FOR FABRICATING ELECTRICAL CONTACTS TO MESA STRUCTURES IN SEMICONDUCTOR DEVICES

CROSS REFERENCE TO RELATED APPLICATION

This application is related to an application entitled "New Structure and Method for Fabricating Indium Phosphide/Indium Gallium Arsenide Phosphide Buried Heterostructure Semiconductor Lasers," Ser. No. 07/583,409, filed simultaneously herewith on Sept. 17, 1990 by R. P. Holmstrom, E. Meland and W. Powazinik, inventors, and assigned to the same assignee as this application.

FIELD OF THE INVENTION

This invention relates to a method of fabricating semiconductor devices containing mesa structures and more particularly to forming electrical contacts on such mesa structures using a novel photolithographic approach.

BACKGROUND OF THE INVENTION

Optoelectronic components such as lasers, optical amplifiers and photodetectors fabricated in semiconducting materials depend upon the reliable formation of low resistance ohmic contacts to semiconductor layers. To make such devices, non-planar structures such as mesas and ridges are often fabricated by etching through successive layers of various compositions. Aligning a narrow stripe contact over a mesa which is only 1 to 5 microns wide and running the entire length of the sample or wafer, (up to several centimeters), such as in the case of a laser, is a difficult task even with field alignment on the mask. Nonplanarity of the photoresist adds to the difficulty of alignment. Consequently, the process is inherently low yielding and unreliable. In addition, for device performance purposes it is paramount to minimize the parasitic resistances.

The self-aligned ohmic contact process used in silicon VLSI technology is very similar in result to the localized flood exposure process disclosed in this application, but is not amenable at this time to the fabrication of optoelectronic components such as laser diodes.

The metallization liftoff process routinely used in gallium arsenide MESFET technology, which is a version of the self-aligned process, may be used in the ohmic metal deposition step of the process of this invention. The planarization process is very similar, but it does not utilize localized flood exposure, not does it yield bare sidewalls, a salient feature of the process of this invention.

OBJECTS OF THE INVENTION

Accordingly, it is a primary object of this invention to obviate the above noted and other disadvantages of the prior art.

It is a further object of this invention to easily and reproducibly provide a large contact opening to such non-planar structures in a manner that the alignment procedure for the contact is not critical.

It is yet a further object of this invention to permit optional diffusion of dopant into and/or epitaxial growth on the exposed region, particularly the exposed sidewalls.

It is a still further object of this invention to provide a greater area for electrical contact, thereby giving a lower contact resistance and greater heat-sinking capability.

SUMMARY OF THE INVENTION

In a first aspect of the invention, a semiconductor mesa structure is covered with a photoresist material in a manner that the photoresist material is thinner on the top of the mesas and also at the upper most portion of the sidewalls than at the base of the mesa and the intervening channel. The photoresist is then exposed through a mask in a manner so that when developed, the photoresist from the mesa top and upper most portion of the sidewall can be removed. When the photoresist is exposed to the actinic radiation, the thinner photoresist is adequately exposed more rapidly than the thicker portion nearer the bottom of the mesa, if the mask does not adequately shield the actinic radiation from reaching it. Thus the alignment tolerance is greater than if the photoresist were of uniform thickness.

In a second aspect of this invention, an underlying dielectric is applied to the mesa prior to the application of the photoresist. After exposure to actinic radiation, that portion of the dielectric which has been exposed is removed by anistropic plasma etching.

DETAILED DESCRIPTION OF THE PREFERRED EMBODIMENT

The method of the present invention will now be described in detail by reference to the means for providing an electrical contact to a mesa structure of a semiconductor laser. The process presented herein incorporates a new technique, localized flood exposure, to easily and reproducibly provide a large contact opening to such non-planar structures, and optimal diffusion of dopant into and/or epitaxial growth on the exposed area followed by metal deposition over the exposed area to form large electrical contacts.

Figure 1A:
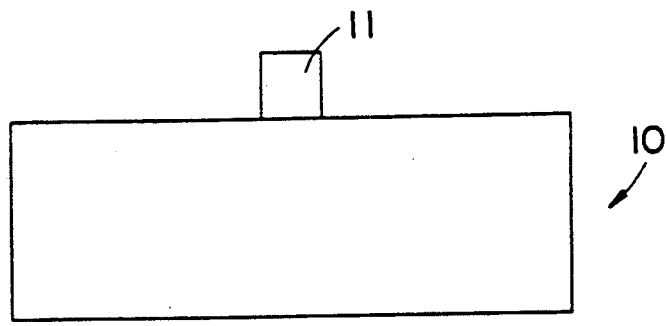
FIGS. 1a, 1b, 1c and 2a, 2b, 2c are cross-sectional views of a semiconductor device which illustrate some steps in processing an embodiment of the invention with respect to a single mesa and double channel mesa, respectively.
Figure 2A:
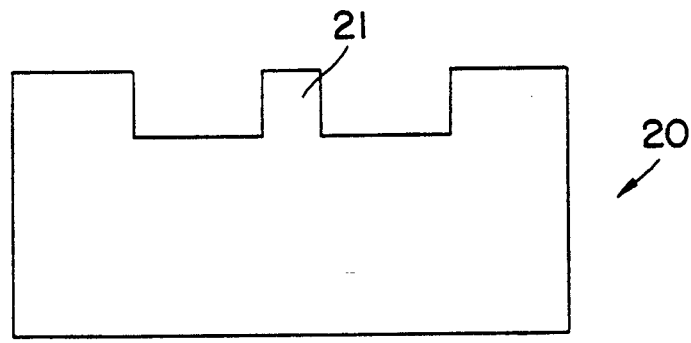

Referring now to the drawings, a semiconductor wafer 10, 20, 30 is processed by conventional means such that mesas 11, 21, 31 with vertical or near-vertical sidewalls of greater than 1 micron in height are formed. FIGS. 1a and 2a show mesas of a single or double channel type, respectively. For a laser semiconductor device, the ridges are preferably 1 to 5 m microns wide and 1 to 4 microns high and hundreds of microns long. Furthermore, the structures are typically made up of several layers of different compositions, numbering from three layers to seven or more.

The method of making a mesa semiconductor structure to produce a laser is set forth in the cross-referenced, copending application of even date herewith and assigned to the assignee of the present invention, which application is incorporated herein by reference.

The photoresist chosen can be either a negative or a positive photoresist. A negative resist is one that remains in areas that were not protected from exposure by the opaque regions of a mask while being removed by developer in regions that were protected. Negative resists are mainly based on the polyisopreme polymer which is polymerized upon exposure to the proper light energy. Positive resists on the other hand are mainly based on the phenol-formaldehyde novolak resin. This polymer is relatively insoluble. After exposure to the proper light energy, the resists convert to a soluble state, a reaction called photosolubilization. While either type of photoresist can be used, a positive resist is preferred because such resists possess higher aspect ratios which means that the resist can be thicker for a given image size opening. The characteristics, properties, uses and method of application and developing are as well known in the art as evidenced by Chapter 8 of "Microchip Fabrication" by Van Zant, McGraw-Hill Publishing Co. (1990).

Figure 1B:
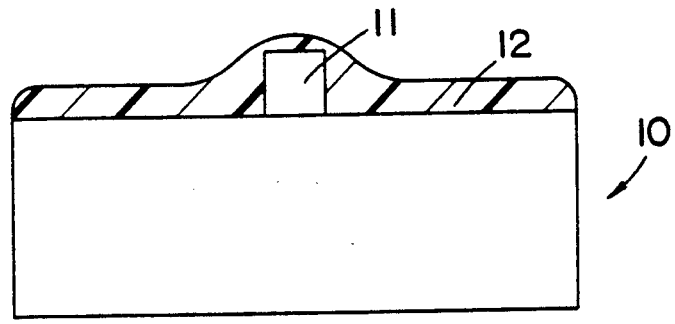
Figure 2B:
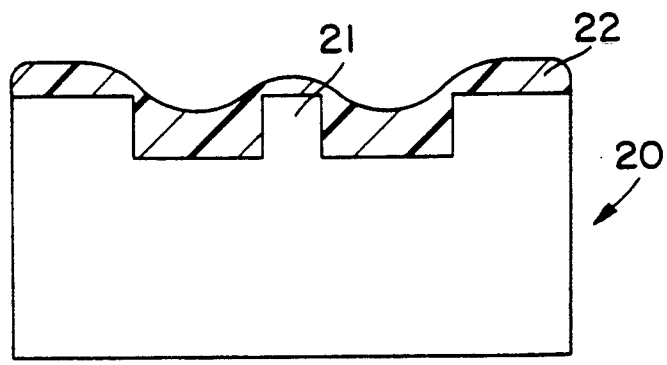

Using standard positive photoresist such as Shipley 1400 series, a viscosity can be chosen so that the resist 12, 22, 32, when deposited, fills in around the mesa bottom to an appreciably greater thickness than that achieved over the top as is shown in FIGS. 1b and 2b. In semiconductor laser design, the aspect ratio namely the ratios of height versus width, of the mesa is normally fixed. Yet this process can be used for varying aspect ratios within a range so long as the resist viscosity is chosen so that the aforementioned resist thickness variations are achieved for all aspect ratios. While a great range of aspect ratios are amenable to the present process, it is much more useful for higher aspect ratios and, in any event, requires a minimum height of the ridge or mesa of 1 micron.

Figure 1C:
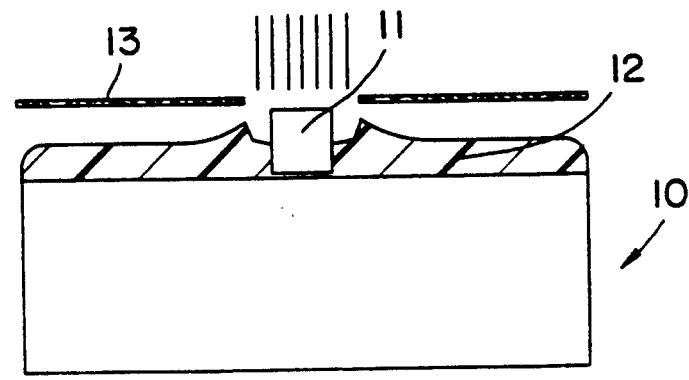
Figure 2C:
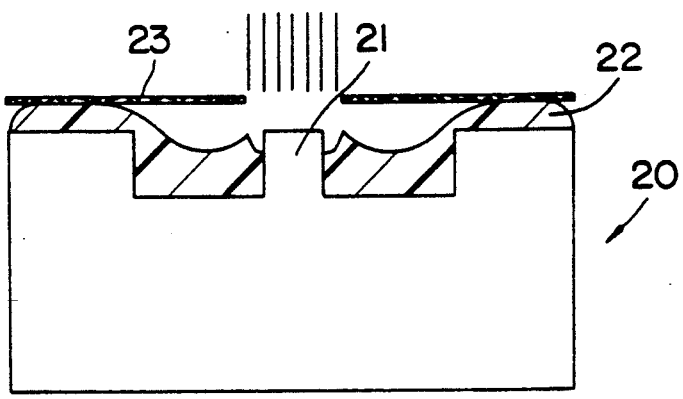

The mask pattern 13, 23 used to form the contact openings is chosen to be wider than the ridge width by that amount allowed by the resist build up on the upper most portion of the sidewalls as shown in FIGS. 1c and 2c. Alignment tolerance and resolution are determined by the mask width chosen and the widths of the mesa top and resist build-up regions. When using a double channel design as in FIGS. 2a, 2b, 2c alignment tolerance and resolution are several microns and, therefore, simple optical lithography with global alignment marks can be used. Thus, the normal optical alignment and resolution tolerances of standard commercial aligners are more than adequate. For exposure times that adequately expose the thickness of photoresist on the top of the ridge, the thicker resist going down the sidewall will be underexposed. When the photoresist is developed the mesa top and an appreciable part of the upper-most portion of the sidewall are exposed, i.e., left unprotected by the photoresist as shown in FIGS. 1c and 2c.

Figure 3A:
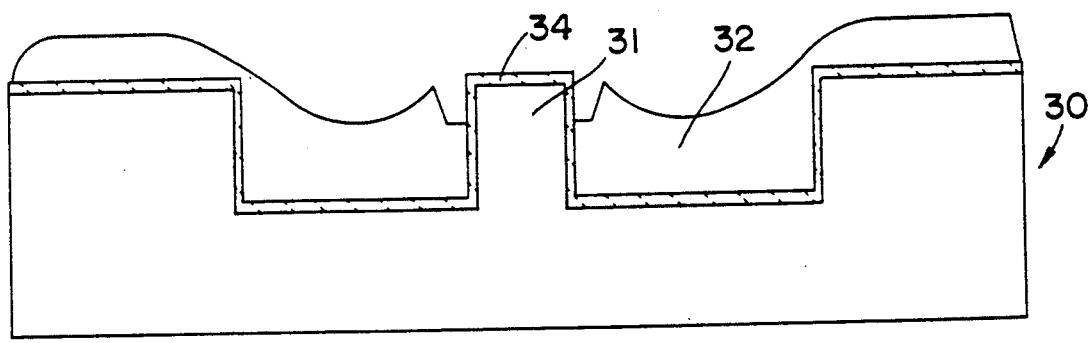
FIGS. 3a, 3b, 3c are cross-sectional views showing the steps to provide an electrical contact on a mesa structure, according to the invention.
Figure 3B:
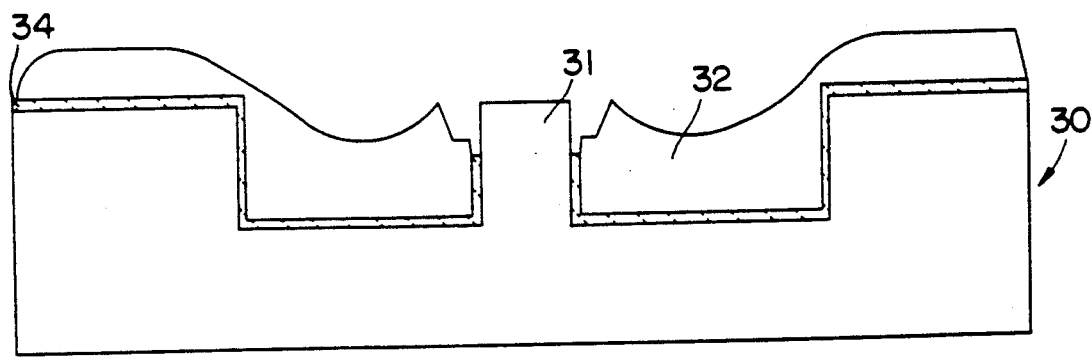
Figure 3C:
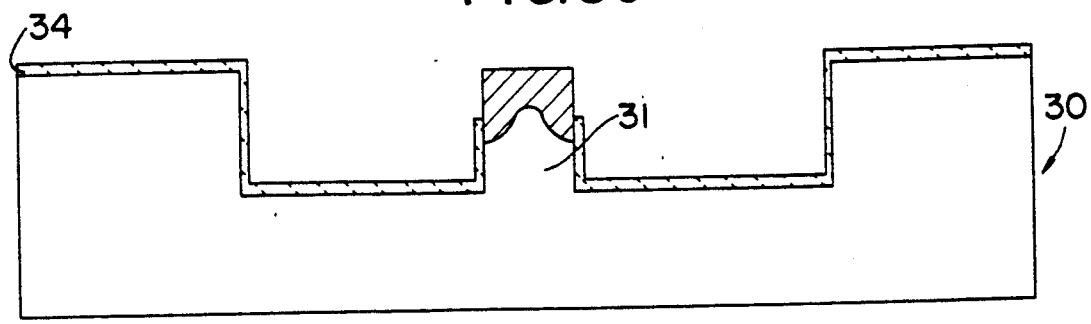

A variety of processes can be performed at this point utilizing this unique structure. For the purpose of low resistance electrical contacts to narrow mesas, an underlying dielectric 34 would have been applied to the mesa prior to applying the aforementioned photoresist as shown in FIG. 3a. The dielectric exposed by the process of the present invention is then removed by conventional anisotropic plasma etching techniques and the extent of the etching of the dielectric down the mesa sidewall is dependent only on the dry etch time to the limit imposed by the resist erosion which occurs during the etching process (FIG. 3b). Diffusion of acceptor or donor dopant can be performed so that the entire exposed surface and an appreciable amount of the bulk of the top mesa layer is electrically modified to produce lower resistivity contacts and thus lower series resistance (FIG. 3c). Both the contact resistance and bulk series resistance are significantly lowered as a result of this process and it is believed that the lowest possible series resistance is achieved as a result of this process.

As a unique result of the localized flood exposure process, ohmic contact metal, when deposited, achieves the largest area of contact possible in this structure and, thus, low contact resistance and low series resistance are both achieved. In addition, the low series and contact resistance, in conjunction with contact metal coverage around the mesa, yield a significant advantage over other techniques with respect to the thermal properties of the device, because less resistive heat is generated and the heat conduction path to remove heat from the device is maximized for this structure.

In sum, the advantages of the method of this invention are:

1) the alignment procedure for an ohmic contact is not critical, making the alignment procedure higher yielding and more reproducible;

2) the coverage of the mesa with contact metallization and, thus, the area of electrical contact is significantly greater than with other techniques, and thus the contact resistance is appreciably less and the heat sinking through the contact metal is appreciably greater; and 3) processes such as diffusion of dopant into the mesa or epitaxial growth on the exposed area which can modify the electrical characteristics and enhance device performance can be easily performed over a larger portion of the mesa and, most significantly, over the exposed sidewall portions of the mesa.

What we claim is:

1. A method of forming an exposed contact region on a mesa structure of a semiconductor device wherein said mesa structure defines an active area and has sidewalls, comprising the steps of:
    depositing photoresist material on said device to form a photoresist layer characterized by non-uniform thickness dimensions wherein said layer covers said mesa and lateral adjacent regions; and
    masking said photoresist layer with a mask pattern having an opening over said mesa structure which is wider than the width of said mesa; and
    sufficiently exposing and developing said masked photoresist layer such that said mask pattern permits a complete removal of photoresist material from the top of the mesa and a portion of the sidewalls, thereby forming said exposed contact region.

2. A method of processing a mesa structure of a semiconductor device wherein said mesa structure defines an active area and has sidewalls, comprising the steps of:
    depositing photoresist material on said device to form a photoresist layer characterized by non-uniform thickness dimensions wherein said layer covers said mesa and lateral adjacent regions; and
    masking said photoresist layer with a mask pattern having an opening over said mesa structure which is wider than the width of said mesa; and
    sufficiently exposing and developing said masked photoresist layer such that said mask pattern permits a complete removal of photoresist material from the top of the mesa and a portion of the sidewals, thereby forming an exposed contact region on said mesa.

3. The method as recited in claim 2 further comprises the steps of:

diffusing dopants into said exposed contact region.

4. The method as recited in claim 2 further comprises the steps of:
epitaxial growth semiconducting material on said exposed mesa top and exposed mesa sidewalls.

5. The method as recited in claim 2 further comprises the steps of:
depositing metal on said exposed mesa top and exposed mesa sidewalls to form an ohmic contact.

6. A method of processing a mesa structure of a semiconductor device wherein said mesa structure defines an active area and has sidewalls, comprising the steps of:
applying an underlying dielectric layer to said device;
depositing photoresist material on said dielectric layer to form a photoresist layer characterized by non-uniform thickness dimensions wherein said photoresist layer covers said mesa and lateral adjacent regions;
masking said photoresist layer with a mask pattern having an opening over said mesa structure which is wider than the width of said mesa;
sufficiently exposing and developing said masked photoresist layer such that said mask pattern permits the exposure of a region of the dielectric layer covering the top of the mesa and a portion of the sidewalls; and
removing the exposed portion of said dielectric layer to form a contact region exposing said portion of said sidewalls and the top of said mesa.

* * * * *